United States Patent
Sumiya et al.

[11] Patent Number: 6,147,498
[45] Date of Patent: Nov. 14, 2000

[54] DEVICE FOR DETECTING FAULT IN SOLENOID VALVE

[75] Inventors: Osamu Sumiya; Toshio Takayama; Kazumoto Sano, all of Yamanashi-ken, Japan

[73] Assignee: Tokico Ltd., Kanagawa-Ken, Japan

[21] Appl. No.: 09/024,581

[22] Filed: Feb. 18, 1998

[30] Foreign Application Priority Data

Feb. 19, 1997 [JP] Japan ................................... 9-035340

[51] Int. Cl.$^7$ .......................... G01R 31/02; G01R 31/08
[52] U.S. Cl. ........................................... 324/415; 418/546
[58] Field of Search .................................. 324/415, 418, 324/546; 340/644, 635

[56] References Cited

U.S. PATENT DOCUMENTS

| | | | |
|---|---|---|---|
| 3,789,876 | 2/1974 | Kempton et al. | 324/696 |
| 3,909,681 | 9/1975 | Campari et al. | 361/154 |
| 4,516,076 | 5/1985 | Pillari et al. | 324/418 |
| 4,733,798 | 3/1988 | Brady et al. | 324/441 |
| 4,875,740 | 10/1989 | Takayama | 303/50 |
| 5,095,275 | 3/1992 | Dechene et al. | 324/454 |
| 5,153,522 | 10/1992 | Sano | 324/418 |
| 5,243,296 | 9/1993 | Ando et al. | 324/418 |
| 5,497,093 | 3/1996 | Sundeen et al. | 324/415 |
| 5,548,210 | 8/1996 | Dittrich | 324/418 |
| 5,638,247 | 6/1997 | Loreck et al. | 361/191 |
| 5,861,746 | 1/1999 | Ensten | 324/654 |

FOREIGN PATENT DOCUMENTS

39 28 651  8/1989  Germany .
42 02 601  1/1992  Germany .

*Primary Examiner*—Safet Metjahic
*Assistant Examiner*—Jermele Hollington
*Attorney, Agent, or Firm*—Wenderoth, Lind & Ponack, L.L.P.

[57] ABSTRACT

A device for detecting a fault in a solenoid valve prevents a feeding system from supplying a drive current to a solenoid valve coil which actuates the solenoid valve from being damaged at the time of detection of the fault. The feeding system is provided with a first switch installed between one end of the solenoid valve coil and a battery, a second switch installed between the other end of the solenoid valve coil and a ground, and a plurality of wires for connecting the battery, the first and second switches and the solenoid valve coil. A test power supply system is connected to one end or the other end of the solenoid valve coil and supplies a micro test current to the solenoid valve coil when a current from the battery to the solenoid valve coil is cut off. A controller controls an operation of the first and second switches, and detects a fault in the feeding system on the basis of a voltage at the end of the solenoid valve coil opposite the end which the test power supply system is connected in accordance with the operating state.

20 Claims, 3 Drawing Sheets

DEVICE FOR DETECTING FAULT IN SOLENOID VALVE

BACKGROUND OF THE INVENTION

The present invention pertains generally to a device for detecting a fault in a solenoid valve (electromagnetic valve), and particularly to a technique for detecting a fault in a solenoid valve employed for an electronic brake control system of a vehicle.

For example, Japanese Patent Application No. 8-250702 discloses a technique relating to an electronic brake control system of a vehicle. According to the electronic brake control system, hydraulic pressure of a wheel cylinder is controlled by using a hydraulic valve (solenoid valve), whose actuation is controlled by means of adjusting a current introduced into a solenoid valve coil by a controller comprising an electronic circuit. Since such a solenoid valve is used for a vehicle wherein safety is critically important, a fault occurring in such a solenoid valve must be detected promptly.

Figure 1:
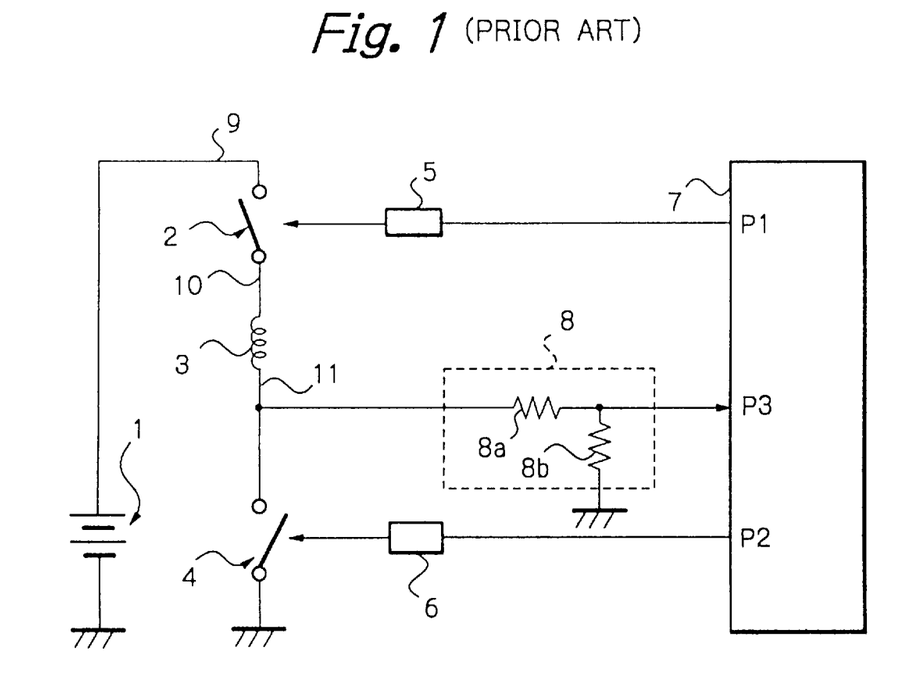
FIG. 1 is a circuit diagram indicating a configuration of a conventional solenoid valve.

For example, one such device for detecting a fault in a solenoid valve has a circuit configuration as indicated in FIG. 1. In the circuit, the numeral 1 denotes a battery of an automobile; 2 is a relay; 3 is a solenoid valve coil; 4 is a switching FET (Field Effect Transistor); 5 is a relay drive circuit for driving the relay 2; 6 is a FET drive circuit for driving the switching FET 4; 7 is a microcomputer (detecting means); 8 is a resistance-type potential divider; 8a and 8b are resistors, each having a high resistance which comprise a resistance-type potential divider 8; 9 is a battery power supply line (wiring); 10 is an electric power supply line of a solenoid valve coil connecting line (wiring); 11 is a grounding line of the solenoid valve coil connecting line (wiring); P1 and P2 are digital output ports of the microcomputer 7; and P3 is a digital input port of the microcomputer 7.

A negative terminal of the battery 1 is grounded, whereas a positive terminal is coupled to one end of the relay 2 via the battery power supply line 9. The other end of the relay 2 is connected to one end of the solenoid valve coil 3 via the electric power supply line 10, whereby, for example:, a drain terminal of the switching FET 4 is connected to another end of the solenoid valve coil 3 via the grounding line 11 and a source terminal of the switching FET 4 is grounded. In other words, the relay 2 is connected to the electric power supply line 10 side of the solenoid valve coil 3 and the switching FET 4 is connected to the grounding line 11 side of the solenoid valve coil 3, whereby a serially-connected circuit consisting of the relay 2, solenoid valve coil 3 and switching FET 4 is connected to both ends of the battery 1.

Further, the relay drive circuit 5 is driven by an output signal from the digital output port P1, while the FET drive circuit 6 is driven by an output signal from the output port P2. The grounding line 11 is connected to the digital input port P3 via the resistance-type potential divider 8. In other words, a voltage of the grounding line 11 is divided by the resistors 8a and 8b, each having a high resistance to be inputted into the digital input port P3. The battery power supply line 9, relay 2, electric power supply line 10, grounding line 11 and switching FET 4 constitute a feeding system for supplying a drive current to the solenoid valve coil 3.

According to a solenoid valve fault detecting device having the above-described constitution, the digital output ports P1 and P2 output signals to turn on/off the relay 2 and/or switching FET 4, and a signal inputted to the digital input port P3 at this time is to detect a fault in the solenoid valve coil 3 and the foregoing feeding system.

For example, if the relay 2 and switching FET 4 are turned off by the output signals from the digital output ports P1 and P2 of the microcomputer 7 while the battery power supply line 9, relay 2, electric power supply line 10 of the solenoid valve coil 3, solenoid valve coil 3, grounding line 11 of the solenoid valve coil 3 and switching FET 4 are operating normally, a current does not run in the solenoid valve coil 3 and thus, a "L" (low) level input signal is supplied to the digital input port P3 of the microcomputer 7.

Further, when the relay 2 is turned on by the output signal from the digital output port P1 of the microcomputer 7 and the switching FET 4 is turned off by the output signal from the digital output port P2 of the microcomputer 7, an electric current from the battery 1 runs in a series circuit consisting of the relay 2, solenoid valve coil 3 and resistors 8a and 8b. An electric current sufficient to drive the solenoid valve does not run in the solenoid valve coil 3 because the resistors 8a and 8b have a high resistance, and a "H" (high) level signal is inputted to the digital input port P3 of the microcomputer 7 via the resistance-type potential divider 8 consisting of the resistors 8a and 8b.

Still further, when the relay 2 and the switching FET 4 are both turned on by the output signals from the digital output ports P1 and P2 of the microcomputer 7, respectively, an electric current sufficient to drive the solenoid valve 3 runs in the solenoid valve coil 3 and thus, the level of the input to the digital input port P3 of the microcomputer 7 becomes "L" (low).

If a fault occurs in the battery power supply line 9, electric power supply line 10 of the solenoid valve coil 3, grounding line 11 of the solenoid valve coil 3, relay 2 or switching FET 4, the following state occurs.

For example, when the electric power supply line 10 or the grounding line 11 are short circuited with the battery power supply line 9, a "H" (high) level signal is inputted to the digital input port P3 of the microcomputer 7 despite the fact that the microcomputer 7 is outputting, from the digital output ports P1 and P2, signals for turning off the relay 2 and the switching FET 4.

Further, when the electric power supply line 10 the grounding line 11 is disconnected or grounded, when the battery power supply line 9 is disconnected or when the relay 2 cannot be turned on due to a problem in the relay drive circuit 5 or the relay 2, a "L" (low) level signal is inputted to the digital input port P3 of the microcomputer 7 despite the fact that the microcomputer 7 is outputting from the digital output port P1 a signal for turning on the relay 2 and from the digital output port P2 a signal for turning off the switching FET 4.

When the switching FET 4 cannot be turned on due to a failure in the FET drive circuit 6 or the switching FET 4, a "H" (high) level signal is inputted to the digital input port P3 of the microcomputer 7 despite the fact that the microcomputer 7 is outputting from the digital output ports P1 and P2 signals for turning on the relay 2 and the switching FET 4, respectively.

When a fault occurs in the feeding system for supplying the current to the solenoid valve coil 3, the aforementioned prior art device detects such a fault by checking a voltage level at the digital input port P3 in various operating states of the relay 2 and the switching FET 4 as is described above. For example, when such a fault as grounding or disconnection of the electric power supply line 10 or the grounding line 11 occurs, the digital output port P1 of the microcomputer 7 outputs a signal for turning on the relay 2, and the microcomputer 7 checks whether or not the voltage level at the digital input port P3 becomes "H" (high) when the relay 2 is turned on, thereby determining whether the fault occurred.

According to the foregoing prior art device, grounding or disconnecting the electric power supply line 10 or the grounding line 11 is detected when the relay 2 is on and thus, a heavy current from the battery 1 runs in the battery power supply line 9 and the relay 2 and can damage them when, for example, such a fault as grounding of the electric power supply line 10 occurs. Further, since the solenoid valve coil 3 has low resistance and the resistors 8a and 8b comprising the resistance-type potential divider 8 have a high resistance, a voltage level at the digital input port P3 of the microcomputer 7 in the case where both ends of the solenoid valve coil 3 are short-circuited with the relay 2 being on, indicates a very small change from the voltage level in the case where the solenoid valve coil 3 is operating normally. Thus, the prior art device is not able to detect short circuiting, etc., of the solenoid valve coil 3, which is disadvantageous.

SUMMARY OF THE INVENTION

Given the aforementioned problem of the prior art, the present invention has been created with a view to accomplish the following objects:

(1) to provide a solenoid valve fault detecting device which is able to prevent a feeding system of a solenoid valve coil from being damaged at the time of detection of a fault;

(2) to provide a solenoid valve fault detecting device which is able to detect a fault in a feeding system of a solenoid valve coil without directly using a battery of an automobile; and (3) to provide a solenoid valve fault detecting device which is able to accurately detect a short circuit on both ends of a solenoid valve coil.

With a view to accomplishing the aforementioned objects, the present invention employs a solenoid valve coil for actuating a solenoid valve when a drive current runs in the solenoid valve coil, and a feeding system for supplying the drive current to the solenoid valve coil. The feeding system is provided with a first switch installed between one end of the solenoid valve coil and a battery, a second switch installed between the other end of the solenoid valve coil and the ground and a plurality of wires connecting the battery, first and second switches and the solenoid valve coil. A test electric power supply system is connected to one end or the other end of the solenoid valve coil and supplies a micro test current to the solenoid valve coil when the drive current to the solenoid valve coil is cut off. A controller is also provided which controls an operating state of the first and second switches and detects a fault in the feeding system on the basis of a voltage at one end or the other end of the solenoid valve coil, to the end which the test electric power supply system is not connected.

Further, the present invention employs the aforementioned elements, wherein the controller is a microcomputer and the test electric power supply system employs digital output ports of the microcomputer as a source of supply of the test current.

Still further, the present invention employs a solenoid valve coil for actuating a solenoid valve when a drive current runs in the solenoid valve coil, and a feeding system for supplying the drive current to the solenoid valve coil. The feeding system being provided with a first switch installed between one end of the solenoid valve coil and a battery, a second switch installed between the other end of the solenoid valve coil and the ground and a plurality of wires connecting the battery, first and second switches and the solenoid valve coil. A test electric power supply system is connected to one end or the other end of the solenoid valve coil and supplies a micro test current to the solenoid valve coil when the drive current to the solenoid valve coil is cut off. A differential amplifier circuit is provided for amplifying a difference between a voltage at one end of the solenoid valve coil and a voltage at the other end of the solenoid valve coil and a controller is also provided which controls an operating state of the first and second switches and detects a fault in the feeding system on the basis of an output voltage from the differential amplifier circuit.

A device according to the present invention comprises a solenoid valve coil for actuating a solenoid valve when a drive current runs in the solenoid valve coil, and a feeding system for supplying a drive current to the solenoid valve coil. The feeding system including a first switch disposed between one end of the solenoid valve coil and a battery, a second switch disposed between the other end of the solenoid valve coil and the ground and a plurality of wires connecting the battery, the first and second switches and the solenoid valve coil. A test electric power supply system which is connected to one end or the other end of the solenoid valve coil supplies a micro test current to the solenoid valve coil when the said drive current to the solenoid valve coil is cut off. A computer is provided for controlling an operation of the first and second switches and detecting a fault in the said feeding system on the basis of a voltage on one end or the other end of the solenoid coil, to the end the test power supply system is not connected, it is possible to detect an operation fault in the first and second switches constituting the feeding system or a short circuit, grounding or disconnection of each wire only by the micro test current instead of using the battery.

According to the conventional device for detecting a fault in a feeding system by using a battery, some types of faults result in a heavy current running into a feeding system which results in the destruction of components. However, as the test current in the present device is set to be a micro current, damage to the components can be prevented.

Since a digital output port of a computer is utilized as the supply source of a test current in the present device, it is not necessary to employ a separate test electric power supply for the test current. Further, since the input port of the computer for detecting a fault can be a digital input port, it is possible to cut down the cost.

The present device comprises a differential amplifier for amplifying a difference between a voltage at one end of a solenoid valve coil and a voltage at the other end of the solenoid valve coil, whereby a fault in the feeding system is detected by a computer on the basis of an output voltage from the said differential amplifier. Thereby, a short circuit between the ends of the solenoid valve coil can be detected accurately.

The foregoing and other objects, features and advantages of the present invention will be apparent from the following detailed description and appended claims taken in connection with the accompanying drawings.

DETAILED DESCRIPTION OF THE INVENTION

Hereafter, a plurality of embodiments of a solenoid valve fault detecting device concerning the present invention will be explained by way of the accompanying drawings.

Figure 2:
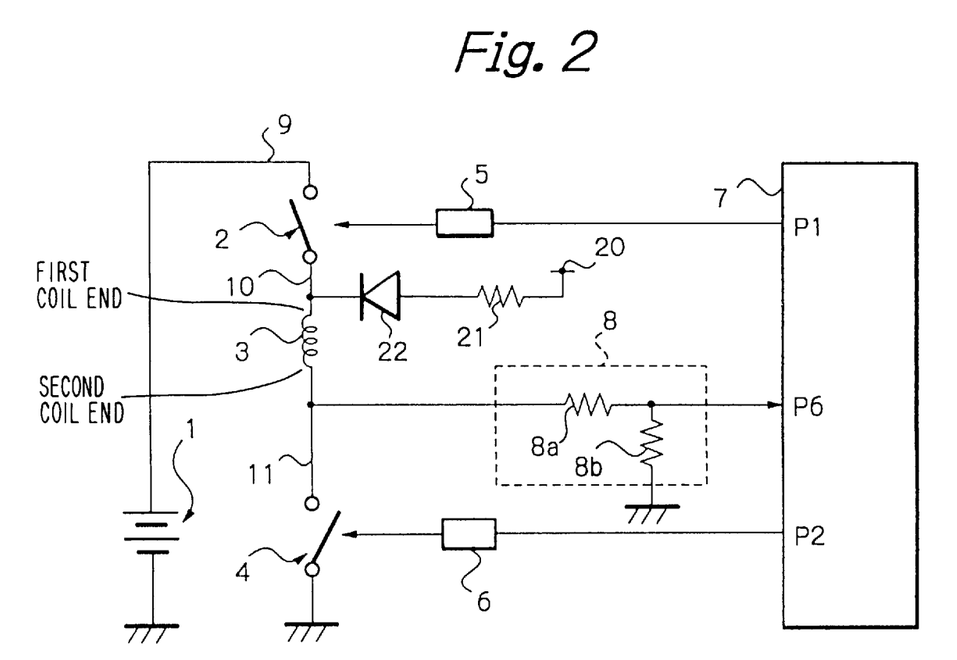
FIG. 2 is a circuit diagram indicating a configuration of the first embodiment of a device for detecting a fault in a solenoid valve according to the present invention.

First, a first embodiment of the present invention will be explained by way of FIG. 2. The same components are denoted by the same numerals in FIGS. 1 and 2. Thus, an explanation of the components already mentioned in relation to FIG. 1 will be omitted. In FIG. 2, the numeral 20 denotes a test electric power supply; 21 is a current limiting resistor having a high resistance whose one end is connected to the test electric power supply 20; 22 is a diode whose anode terminal and cathode terminal are connected, respectively, to the other end of the current limiting resistor 21 and the electric power supply line 10 of the solenoid valve coil 3 having first and second coil ends; P6 is an analog input port of the microcomputer 7.

More specifically, an output from the test electric power supply 20 is supplied to the electric power supply line 10 of the solenoid valve coil 3 via a series circuit consisting of the current limiting resistor 21 and the diode 22. The test electric power supply 20, the current limiting resistor 21 and the diode 22 comprise a test electric power supply system.

Since the output voltage from the test electric power supply 20 is set to be smaller than the output voltage from the battery 1 and diode 22 is connected under the condition of the aforementioned polarity, the output from the battery 1 is supplied to the electric power supply line 10 when the relay 2 is closed. On the other hand, when the relay 2 is open, the diode 22 is conducting electricity and thus, the output from the test electric power supply 20 is supplied to three electric power supply line 10. In this case, a micro test current not sufficient to drive the solenoid valve is supplied to the solenoid valve coil 3 because the current limiting resistor 21 is designed to have a high resistance.

When the battery power supply line 9, relay 2, electric power supply line 10 and grounding line 11 of the solenoid valve coil connecting line and switching FET 4 are operating normally, the following signal is inputted into the analog input port P6 of the microcomputer 7.

Specifically, when the relay 2 is turned off (opened) by the signal supplied to the relay drive circuit 5 from the digital output port P1 of the microcomputer 7 and the switching FET 4 is turned off by the signal supplied to the FET drive circuit 6 from the digital output port P2 of the microcomputer 7, the test current is supplied to the solenoid valve coil 3 from the test electric power supply 20 via the diode 22 and the current limiting resistor 21.

In this case, a signal of a voltage obtained by dividing an output voltage from the test electric power supply 20 by the current limiting resistor 21, and a series resistance value of the resistor 8a and the resistor 8b, is inputted into the analog input port P6 of the microcomputer 7. Since the current limiting resistor 21, the resistor 8a or the resistor 8b has a high resistance in this state, a current sufficient to drive the solenoid valve does not flow in the solenoid valve coil 3 and therefore, the solenoid valve is not actuated.

When the relay 2 is turned on (in the conducting state) by the output signal from the digital output port P1 of the microcomputer 7, the diode 22 is cut off and the output voltage from the battery 1 is supplied to the electric power supply line 10. Thus, into the analog input port P6 of the microcomputer 7 is inputted a signal of a voltage obtained by dividing the output voltage from the battery 1 by the resistance-type potential divider 8. Since the resistors 8a and 8b have a high resistance, the solenoid valve is not actuated. Also, the current flow from the battery 1 to the test electric power supply 20 is deterred by the diode 22.

If the switching FET 4 is turned on by the output signal from the digital output port P2 of the microcomputer 7 after the relay 2 is turned on as mentioned above, an electric current sufficient to drive the solenoid valve flows from the battery 1 into the solenoid valve coil 3 while a signal of almost zero potential is supplied to the analog input port P6 of the microcomputer 7.

Further, when the output signal from the digital output port P1 turns off the relay 2 while the output signal from the digital output port P2 turns on the FET 4, a signal of zero potential is supplied to the analog input port P6 of the microcomputer 7.

Next, when a fault such as 2 short circuit, grounding, etc., occurs in the battery power supply line 9, relay 2, electric power supply line 10 and grounding line 11 of the solenoid valve coil connecting line or switching FET 4, a signal of the following voltage is supplied to the analog input port P6 of the microcomputer 7.

For example, if a fault such as grounding or disconnection of the electric power supply line 10 or the grounding line 11 occurs, a signal of zero potential is supplied to the analog input port P6 of the microcomputer 7, irrespective of the output signals from the digital output ports P1 and P2 of the microcomputer 7.

Still further, when a fault which prevents the switching FET 4 from being turned on occurs due to a failure of the FET drive circuit 6 or the switching FET 4, a signal of non-zero potential, that is a signal of a voltage obtained by dividing the output voltage from the test electric power supply 20 by the current limiting resistor 21 and the resistance-type potential divider 8 is inputted into the analog input port P6 of the microcomputer 7 despite the fact that the output signal from the digital output port P1 turned off the relay 2 and the output signal from the digital output port P2 turned on the switching FET 4.

Specifically, the microcomputer 7 is able to detect, on the basis of the output voltage from the test electric power supply 20, a fault causing grounding or disconnection of the electric power supply line 10 or the grounding line 11 before the relay 2 is turned on by the output signal from the digital output port P1.

On the other hand, when a fault which prevents the relay 2 from being turned on occurs due to disconnection of the battery power supply line 9 or a failure in the relay drive circuit 5 or the relay 2, a signal of a voltage obtained by dividing the output voltage from the test electric power supply 20 by the current limiting resistor 21 and the resistors 8a and 8b constituting the resistance-type potential divider 8, is inputted into the analog input port P6 of the microcomputer 7 despite the fact that the output signal from the digital output port P1 of the microcomputer 7 turned on the relay 2 and the output signal from the digital output port P2 of the microcomputer 7 turned off the switching FET 4.

Thus, the microcomputer 7 is able to detect a fault in the battery power supply line 9 or the relay 2. In this case, the fault is detected by supplying the output from the battery 1 to the electric power supply line 10 with the relay 2 being turned on by the output signal from the digital output port P1 of the microcomputer 7. However, by prohibiting the relay 2 from being turned on based on the aforementioned detecting operation, it is possible to avoid damage to components caused by a heavy current when the relay 2 is turned on.

A plurality of solenoid valves are installed in an electronic control device for a vehicle so as to control each part of the vehicle. The plurality of solenoid valves are also able to accurately detect a fault in feeding systems for solenoid valve coils by the same means as described above with respect to the single solenoid valve.

Figure 3:
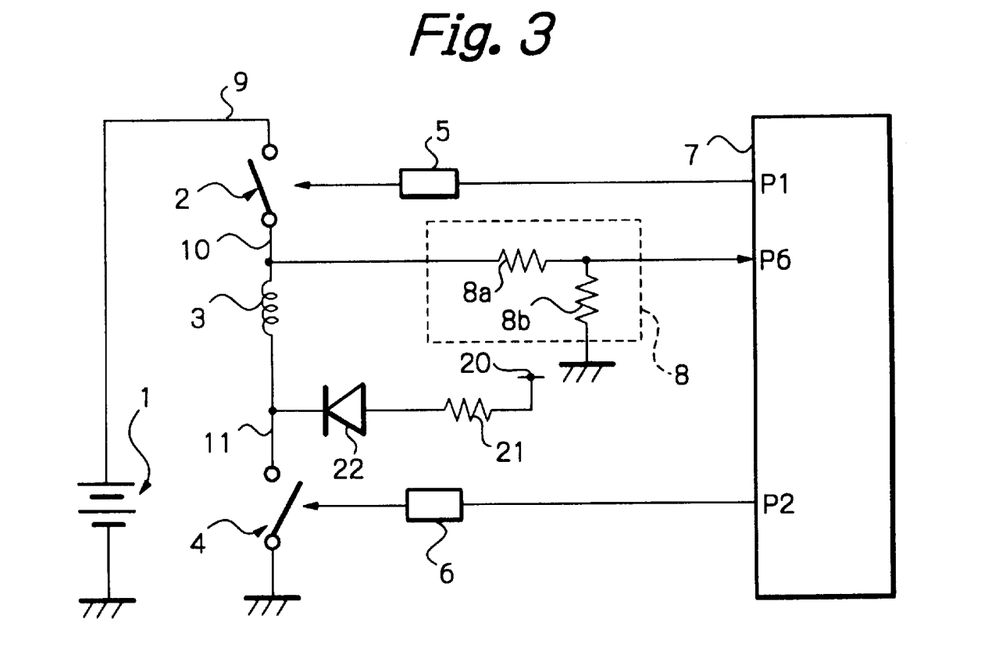
FIG. 3 is a circuit diagram indicating a configuration of the second embodiment of a device for detecting a fault in a solenoid valve according to the present invention.

Next, a second embodiment of the present invention will be explained by way of FIG. 3.

According to the second embodiment, the test electric power supply system consisting of the test electric power supply 20, the current limiting resistor 21 and the diode 22 is connected to the grounding line 11 of the solenoid valve coil 3, and the signal of the electric power supply line 10 of the solenoid valve coil 3 is inputted into the analog input port P6 of the microcomputer 7 via the resistance-type potential divider 8, apart from which the configuration of the second embodiment is the same as that of the first embodiment. In other words, the cathode terminal of the diode 22 is connected to the grounding line 11 to supply the test current, whereas the signal of the electric power supply line 10 is divided by the resistors 8a and 8b to be inputted into the analog input port P6.

The second embodiment having the above-described configuration is also able to detect a fault in the battery power supply line 9, the relay 2, the electric power supply line 10, the grounding line 11 or the switching FET 4 on the basis of the electric current supplied by the test electric power supply system in the same manner as mentioned with respect to the first embodiment.

Further, as for other solenoid valves not indicated in the drawing, a fault in the valves can also be detected in the same manner as mentioned with respect to the first embodiment.

Figure 4:
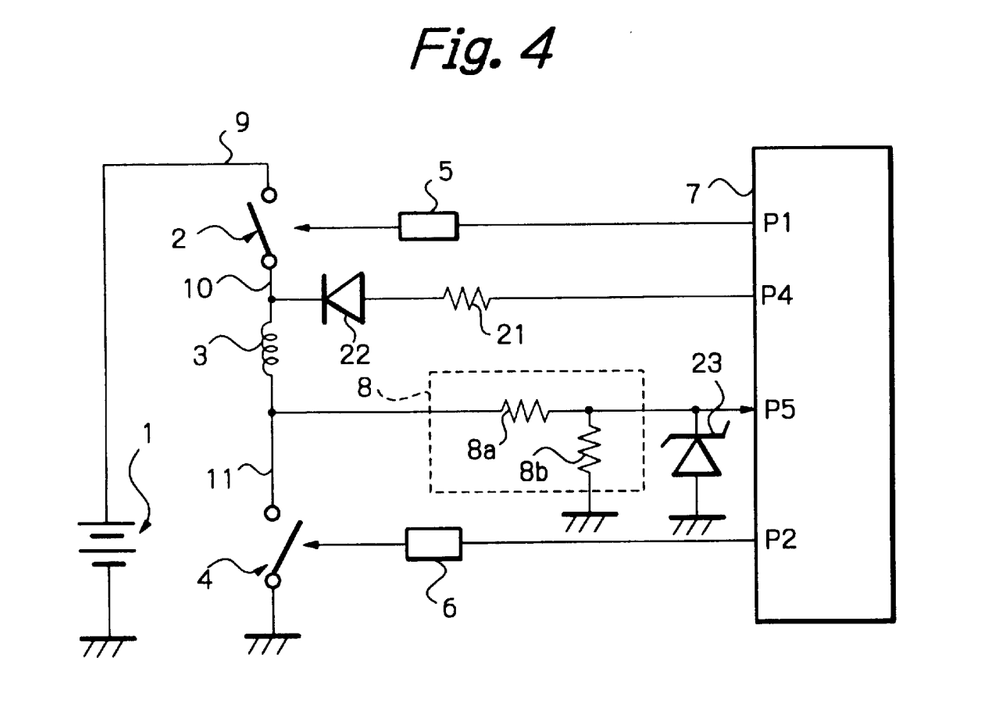
FIG. 4 is a circuit diagram indicating a configuration of the third embodiment of a device for detecting a fault in a solenoid valve according to the present invention.

Next, a third embodiment of the present invention will be explained by way of FIG. 4.

According to the third embodiment, as is indicated in the drawing, a voltage is supplied from a digital output port P4 of the microcomputer 7 instead of from the test electric power supply 20, and a Zener diode 23 is connected between a digital input port P5 of the microcomputer 7 and a grounding point (GND) under a polarity being such that a cathode of the diode 23 is connected to the digital input port P5 whereas an anode of the diode 23 is connected to the grounding point (GND). A clamp voltage of the Zener diode 23 is set in such a way as to be recognized to be of a "H" (high) level by the microcomputer 7.

Since the electric current to be supplied from a test power supply system to feeding system for the solenoid valve coil 3 may be a micro current not sufficient to drive the solenoid valve, it is possible to supply the test current from the digital output port P4. By inserting the Zener diode 23 as mentioned above, an abnormally high voltage is prevented from being applied to the digital input port P5.

When the battery power supply line 9, relay 2, electric power supply line 10 and grounding line 11 of the solenoid valve coil connecting line, and switching FET 4 are operating normally, the following signal is inputted into the digital input port P5 of the microcomputer 7.

Specifically, before the electric current flows into the solenoid valve coil 3, the relay 2 is turned off by an output signal from a digital output port P1 of the microcomputer 7 while the switching FET 4 is turned off by an output signal from a digital output port P2 of the microcomputer 7, and an output signal from the digital output port P4 of the microcomputer 7 is supplied to the electric power supply line 10 via the current limiting resistor 21 and the diode 22. For example, if a "H" (high) level signal is outputted from the digital output port P4, a voltage which is recognized to be of a "H" (high) level by the microcomputer 7 is inputted to the digital input port P5 by the resistance-type potential divider 8 which sets a dividing ratio to be high.

If a "L" (low) level signal is outputted from the digital output port P4 in the same state as described above, a "L" (low) level signal is inputted to the digital input port P5. When the relay .2 is turned on by the output signal from the digital output port P1 of the microcomputer 7 in order to prepare an electric current to flow into the solenoid valve coil 3, a potential of the electric power supply line 10 becomes an output voltage from the battery 1 and thus, the diode 22 is cut off, whereby the supply of an electric current to the solenoid valve coil 3 is cut off, regardless of a level of the signal outputted from the digital output port P4 of the microcomputer 7.

At this time, a voltage clamped by the Zener diode 23 is applied to the digital input port P5 of the microcomputer 7. Specifically, a voltage which is recognized to be of a "H" (high) level by the microcomputer 7 is inputted to the digital input port P5. By turning on the switching FET 4 by the output signal from the digital output port P2 after the relay 2 is turned on by an output signal from the digital output port P1 of the microcomputer 7, an electric current flows into the solenoid valve coil 3, whereby the grounding line is grounded and thus, a "L" (low) level signal is inputted to the digital input port P5 of the microcomputer 7.

Further, if the relay 2 is turned off by an output signal from the digital output port P1 of the microcomputer 7 and the switching FET 4 is turned on by an output signal from the digital output port P2 of the microcomputer 7, a "L" (low) level signal is inputted to the digital input port P5 of the microcomputer 7, regardless of a level of an output signal from the digital output port P4 of the microcomputer 7.

On the other hand, when a fault is occurring in the battery power supply line 9, the relay, 2, the electric power supply line 10 and the grounding line 11 of the solenoid valve coil connecting line or the switching FET 4, a signal of the following level is inputted to the digital input port P5.

Specifically, when such a fault as a short-circuiting of the electric power supply line 10 or the grounding line 11 occurs, a "H" (high) level signal is inputted to the digital input port P5 of the microcomputer 7 in the same way as it is during normal operation. However, when the output signal from the digital output port P4 is a "L" (low) level signal, a "H" (high) level signal is inputted unlike in a normal operation case.

When such a fault as grounding or disconnecting of the electric power supply line 10 or the grounding line 11 occurs, a "L" (low) level signal is inputted to the digital input port P5 unlike the normal operation case if an output signal from the digital output port P4 of the microcomputer 7 is a "H" (high) level signal.

Further, when a fault which prevents the switching FET 4 from being turned on due to a failure in the FET drive circuit 6 or the switching FET 4 occurs, a "H" (high) level signal is inputted to the digital input port P5 unlike the normal operation case despite the fact that the digital output port P1 and the digital output port P2 of the microcomputer 7 are outputting a signal for turning off the relay 2 and a signal for turning on the switching FET 4, respectively, and the digital output port P4 is outputting a "H" (high) level signal.

As is explained above, the microcomputer 7 is able to detect, on the basis of the level of the signal inputted into the digital input port 5, a fault occurring in the electric power supply line 10 or the grounding line 11 of the solenoid valve coil connecting line or the switching FET 4 before the relay 2 is turned on by the output signal from the digital output port P1.

When a fault which prevents the relay 2 from being turned on due to disconnection of the battery electric power supply line 9 or failure in the relay drive circuit 5 or relay 2 occurs, a "L" (low) level signal is inputted to the digital input port P5 of the microcomputer 7 unlike the normal operation case despite the fact that the digital output port P1 is outputting a signal for turning on the really 2 and the digital output port P2 of the microcomputer 7 is outputting a signal for turning off the switching FET 4 and further, the digital output port P4 of the microcomputer 7 is outputting a "L" (low) level signal. Thereby, the microcomputer 7 is able to detect a fault occurring in the battery power supply line 9 or the relay 2.

The relay 2 must be turned on to detect such a fault as mentioned above. However, by prohibiting the relay 2 from being turned on based on the aforementioned detecting operation, it is possible to avoid incurring damage to each component as a result of a heavy current when the relay 2 is turned on. As for the other solenoid valves not indicated in the drawing, a fault in the valves can be detected by the same means as described above.

Next, a fourth embodiment of the present invention will be explained in reference to the circuit indicated in FIG. 5.

Figure 5:
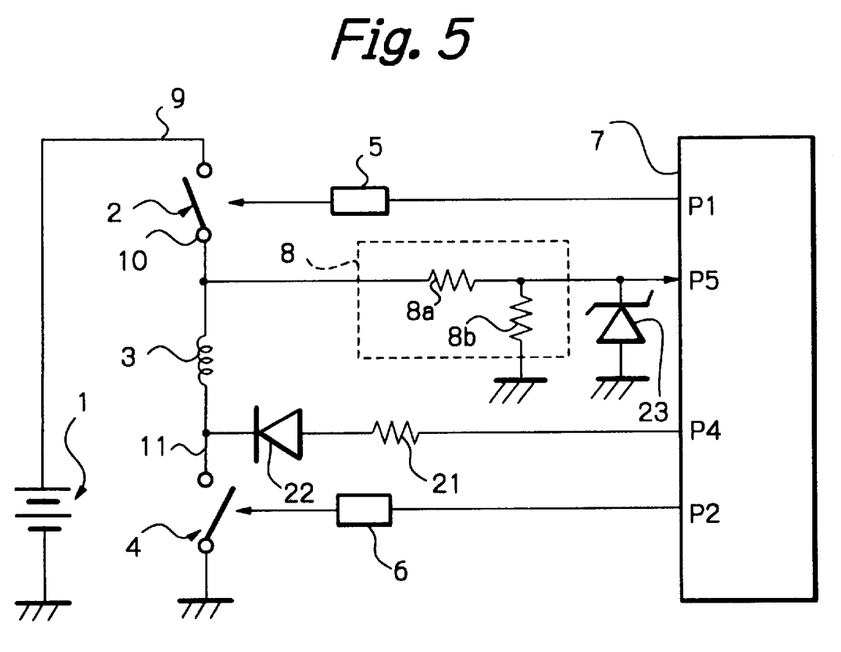
FIG. 5 is a circuit diagram indicating a configuration of the fourth embodiment of a device for detecting a fault in a solenoid valve according to the present invention.

According to the fourth embodiment, as is indicated in FIG. 5, the test electric power supply system is connected to the grounding line 11 of the solenoid valve coil 3 and the electric power supply line 10 of the solenoid valve coil 3 is connected to the digital input port P5 of the microcomputer 7 via the resistance-type potential divider 8 and the Zener diode 23, apart from which the configuration of the fourth embodiment is the same as that of the third embodiment.

Specifically, according to the fourth embodiment, the cathode terminal of the diode 22 is connected to the grounding line 11 to thereby supply to the grounding line 11 the test current supplied from the digital output port P4 of the microcomputer 7 via the current limiting resistor 21, while the signal of the electric power supply line 10 is inputted to the digital input port P5 via the resistor 8a and 8b and the Zener diode 23.

Given the above-described configuration, the fourth embodiment is also able to detect, on the basis of the test current supplied from the digital output port P4 of the microcomputer 7 via the lest power supply system, a fault in the battery power supply line 9, the relay 2, the electric power supply line 10, the grounding line 11 or the switching FET 4. As for solenoid valves not indicated in the drawing, a fault in the valves can be also detected through the same procedure as mentioned in relation to the fourth embodiment.

Next, a fifth embodiment of the present invention will be explained in reference to the circuit described in FIG. 6. The aforementioned first through fourth embodiments are not intended to detect a short circuit of both ends of the solenoid valve coil 3. However, the fifth embodiment is intended for detection of a change in a micro potential difference between the ends of the solenoid valve coil 3 when they are short-circuited.

Figure 6:
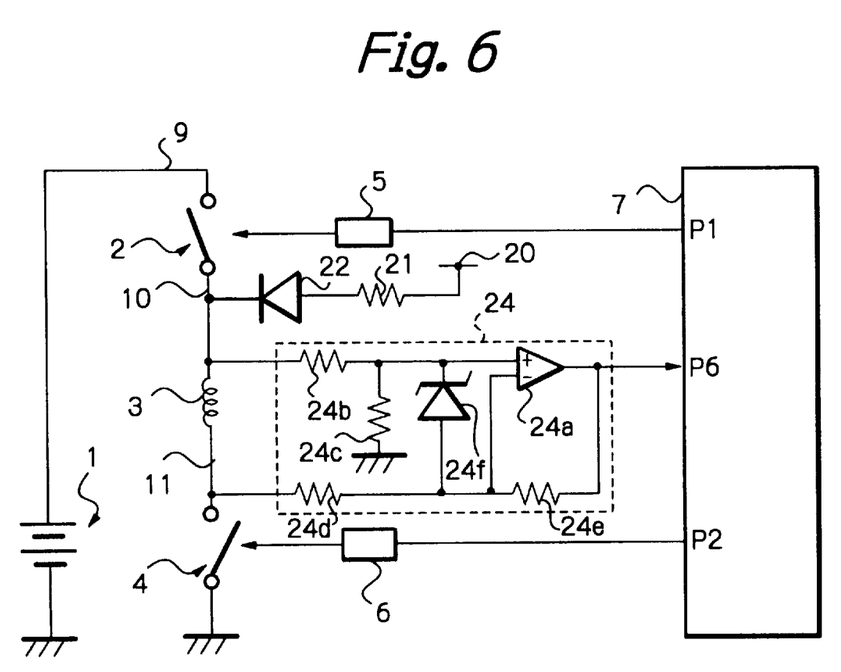
FIG. 6 is a circuit diagram indicating a configuration of the fifth embodiment of a device for detecting a fault in a solenoid valve according to the present invention.

As is indicated in FIG. 6, the fifth embodiment of the present invention has a configuration wherein a differential amplifier circuit 24 for amplifying a potential difference between the ends of the solenoid valve coil 3 is added to the circuit of the first embodiment. Therefore, the same components are denoted by the same numerals in FIGS. 2 and 6, and an explanation of the components appealing in both FIG. 2 and FIG. 6 will be omitted here.

As is indicated in FIG. 6, the differential amplifier circuit 24 consists of an operational amplifier 24a, a resistor 24b having a high resistance which is disposed between a positive-phase input terminal (+) of the operational amplifier 24a and the electric power supply line 10, a resistor 24c having a high resistance which is disposed between the said positive-phase input terminal (+) and a grounding point, a resistor 24d having a high resistance which is disposed between the negative-phase input terminal (−) and the grounding line 11, a resistor 24e having a high resistance which is disposed between the negative-phase input terminal (−) and an output terminal of the operational amplifier 24a (that is the analog input port P6 of the microcomputer 7) and a Zener diode 24f which is disposed between the positive-phase input terminal (+) and the negative-phase input terminal (−) with a polarity such that a cathode terminal of the diode 24f is connected to the positive-phase input terminal (+). The Zener diode 24f is interposed between the positive-phase input terminal (+) and the negative-phase terminal (−) in order to protect the operational amplifier 24a.

In passing a current into the solenoid valve coil 3 according to the device for detecting a fault in the solenoid valve, the relay 2 is first turned on by an output signal from the digital output port P1 of the microcomputer 7 and then, the switching FET 4 is turned on, whereby a drive current is supplied from the battery 1 to the solenoid valve coil 3. On the other hand, when not actuating the solenoid valve, the relay 2 is turned off by the output signal from the digital output port P1 and the switching FET 4 is also turned off by the output signal from the digital output port P2, whereby the drive current from the battery 1 to the solenoid valve coil 3 is cut off and a test current is supplied from the test electric power supply 20 to the solenoid valve coil 3.

Since the switching FET 4 is off in this case, the test current does not run and as a result, the voltage at each end of the solenoid valve coil 3 becomes equal and an output voltage from the differential amplifier circuit 24 which becomes about "OV" (volt). Then, when the operating slate of the switching FET 4 changes from off to on due to the output signal from the digital output port P2, the test current runs to the grounding point via the solenoid valve coil 3 through the current limiting resistor 21 and diode 22.

When the solenoid valve coil 3 and a current-carrying path of the test current are normal, a potential difference arises between the ends of the solenoid valve coil 3 and therefore, the output voltage from the differential amplifier circuit 24 corresponds to an amplification factor set in accordance with each resistance value of the resistors 24b~24e. While the voltage signal is being inputted to the analog input port P6, the microcomputer 7 determines that the solenoid valve coil 3 and its path (consisting of the electric power supply line 10, the grounding line 1 land the switching FET 4) are normal.

However, if the solenoid valve coil 3 is short-circuited in this state, the voltage at each end of the solenoid valve coil 3 becomes equal and thus, the output voltage from the differential amplifier circuit 24 becomes almost 0V even though the switching FET 4 is turned on. The microcomputer 7 determines that the solenoid valve coil 3 is short-circuited when the output voltage from the differential amplifier circuit 24 turns out to be "0V" in this state, that is when the level of the signal inputted to the analog input port P6 is "0V".

Thus, the microcomputer 7 is able to detect a short circuit fault in the solenoid valve coil 3. By prohibiting the relay 2 and switching FET 4 from being turned on based on the aforementioned detection operation, it is possible to avoid incurring damage to each component as a result of a heavy current when the relay 2 and the switching FET 4 are turned on simultaneously. As for a plurality of solenoid valves not indicated in the drawing, a fault in the valves can be detected by the same means as described above.

In the present fifth embodiment, the digital output port P4 of the microcomputer 7 may be used as the supply source of the test current instead of the test current supply 20 as in the third and fourth embodiments.

Although the invention has been described with respect to particular embodiments, it is to be understood that these embodiments are merely illustrative of the principles of the invention. Numerous modifications may be made therein and other arrangements may be devised without departing from the spirit and scope of the invention.

What is claimed is:

1. A device for detecting a fault in a solenoid valve comprising:
    a solenoid valve coil having first and second coil ends;
    a feeding system for supplying a drive current to said solenoid valve coil, said feeding system comprising:
        a grounded battery,
        a first switch electrically connected between said first coil end and said grounded battery, and
        a second switch electrically connected between said second coil end and a ground;
    a test electric power supply system electrically connected to said first coil end, said test electric power supply system being operable to provide a micro test current to said solenoid valve coil when the drive current to said solenoid valve coil is cut off; and
    a controller being operable to control said first and second switches and operable to detect a fault in said feeding system on the basis of a voltage supplied to said second coil end.

2. The device claimed in claim 1, wherein said controller comprises a microcomputer, and said test electric power supply system utilizes a digital output port of said microcomputer as a supply source of the micro test current.

3. The device claimed in claim 2, wherein said microcomputer comprises:
    a first digital output port electrically connected to said first switch for controlling said first switch;
    a second digital output port electrically connected to said second switch for controlling said second switch;
    a third digital output port electrically connected to said first coil end for supplying the micro test current to said first coil end; and
    a digital input port electrically connected to said second coil end for receiving the voltage supplied to said second coil end.

4. The device claimed in claim 3, further comprising:
    a first drive circuit electrically connected between said first digital output and said first switch;
    a second drive circuit electrically connected between said second digital output and said second switch;
    a diode and a resistor electrically connected in series between said third digital output and said first coil end;
    a voltage divider circuit electrically connected between said digital input and said second coil end; and
    a zener diode electrically connected between said digital input and said ground.

5. The device claimed in claim 1, further comprising a voltage divider circuit electrically connected between said controller and said second coil end.

6. The device claimed in claim 1, further comprising:
    a first drive circuit electrically connected between said controller and said first switch;
    a second drive circuit electrically connected between said controller and said second switch;
    a voltage divider circuit electrically connected between said controller and said second coil end; and
    a diode and a resistor electrically connected in series between said test electric power supply system and said first coil end.

7. The device claimed in claim 1, further comprising:
    a differential amplifier circuit electrically connected between said first and second coil ends and said controller, said differential amplifier circuit being operable to amplify a difference between a first voltage at said first coil end and a second voltage at said second coil end; and
    said controller being operable to detect the fault in said feeding system on the basis of an output voltage of said differential amplifier circuit.

8. The device claimed in claim 7, wherein said controller comprises a microcomputer, and said test electric power supply system utilizes a digital output port of said microcomputer as a supply source of the micro test current.

9. The device claimed in claim 8, wherein said microcomputer comprises:
    a first digital output port electrically connected to said first switch for controlling said first switch;
    a second digital output port electrically connected to said second switch for controlling said second switch;
    a third digital output port electrically connected to said first coil end for supplying the micro test current to said first coil end; and
    a digital input port electrically connected to said differential amplifier current for receiving an amplified difference from said differential amplifier circuit.

10. The device claimed in claim 9, further comprising:
    a first drive circuit electrically connected between said first digital output and said first switch;
    a second drive circuit electrically connected between said second digital output and said second switch;
    a diode and a resistor electrically connected in series between said third digital output and said first coil end;
    a voltage divider circuit electrically connected between said digital input and said second coil end; and
    a zener diode electrically connected between said digital input and said ground.

11. A device for detecting a fault in a solenoid valve comprising:
    a solenoid valve coil having first and second coil ends;
    a feeding system for supplying a drive current to said solenoid valve coil, said feeding system comprising:

a grounded battery, a first switch electrically connected between said first coil end and said grounded battery, and a second switch electrically connected between said second coil end and a ground;

a test electric power supply system electrically connected to said second coil end, said test electric power supply system providing a micro test current to said solenoid valve coil when the drive current to said solenoid valve coil is cut off; and a controller operable to control said first and second switches and operable to detect a fault in said feeding system on the basis of a voltage supplied to said first coil end.

12. The device claimed in claim 11, wherein said controller comprises a microcomputer, and said test electric power supply system utilizes a digital output port of said microcomputer as a supply source of the micro test current.

13. The device claimed in claim 12, wherein said microcomputer comprises:

a first digital output port electrically connected to said first switch for controlling said first switch;

a second digital output port electrically connected to said second switch for controlling said second switch;

a third digital output port electrically connected to said second coil end for supplying the micro test current to said second coil end; and a digital input port electrically connected to said first coil end for receiving the voltage supplied to said first coil end.

14. The device claimed in claim 13, further comprising:

a first drive circuit electrically connected between said first digital output and said first switch;

a second drive circuit electrically connected between said second digital output and said second switch;

a diode and a resistor electrically connected in series between said third digital output and said second coil end;

a voltage divider circuit electrically connected between said digital input and said first coil end; and a zener diode electrically connected between said digital input and said ground.

15. The device claimed in claim 11, further comprising a voltage divider circuit electrically connected between said controller and said first coil end.

16. The device claimed in claim 11, further comprising:

a first drive circuit electrically connected between said controller and said first switch;

a second drive circuit electrically connected between said controller and said second switch;

a voltage divider circuit electrically connected between said controller and said first coil end; and a diode and a resistor electrically connected in series between said test electric power supply system and said second coil end.

17. The device claimed in claim 11, further comprising:

a differential amplifier circuit electrically connected between said first and second coil ends and said controller, said differential amplifier circuit being operable to amplify a difference between a first voltage at said first coil end and a second voltage at said second coil end; and said controller being operable to detect the fault in said feeding system on the basis of an output voltage of said differential amplifier circuit.

18. The device claimed in claim 17, wherein said controller comprises a microcomputer, and said test electric power supply system utilizes a digital output port of said microcomputer as a supply source of the micro test current.

19. The device claimed in claim 18, wherein said microcomputer comprises:

a first digital output port electrically connected to said first switch for controlling said first switch;

a second digital output port electrically connected to said second switch for controlling said second switch;

a third digital output port electrically connected to said second coil end for supplying the micro test current to said second coil end; and a digital input port electrically connected to said differential amplifier circuit for receiving an amplified difference from said differential amplifier circuit.

20. The device claimed in claim 19, further comprising:

a first drive circuit electrically connected between said first digital output and said first switch;

a second drive circuit electrically connected between said second digital output and said second switch;

a diode and a resistor electrically connected in series between said third digital output and said second coil end;

a voltage divider circuit electrically connected between said digital input and said first coil end; and a zener diode electrically connected between said digital input and said ground.

* * * * *